(12) United States Patent
Leung et al.

(10) Patent No.: US 8,987,706 B2
(45) Date of Patent: Mar. 24, 2015

(54) HIGHLY CONDUCTIVE NANO-STRUCTURES INCORPORATED IN SEMICONDUCTOR NANOCOMPOSITES

(71) Applicant: The Hong Kong Polytechnic University, Hong Kong (HK)

(72) Inventors: Wallace Woon-Fong Leung, Hong Kong (HK); Lijun Yang, Hong Kong (HK)

(73) Assignee: The Hong Kong Polytechnic University, Hunghom, Kowloon (HK)

( * ) Notice: Subject to any disclaimer, the term of this patent is extended or adjusted under 35 U.S.C. 154(b) by 0 days.

(21) Appl. No.: 14/100,016

(22) Filed: Dec. 9, 2013

(65) Prior Publication Data

US 2014/0158986 A1    Jun. 12, 2014

Related U.S. Application Data

(60) Provisional application No. 61/735,068, filed on Dec. 10, 2012.

(51) Int. Cl.
*H01L 29/06* (2006.01)
*H01L 31/0352* (2006.01)
(Continued)

(52) U.S. Cl.
CPC .... *H01L 29/0669* (2013.01); *H01L 31/035218* (2013.01); *H01L 31/035227* (2013.01); *B82Y 99/00* (2013.01); *H01L 21/02606* (2013.01); *H01L 21/02422* (2013.01); *H01L 21/02444* (2013.01); *H01L 21/02513* (2013.01); *H01L 21/02565* (2013.01); *H01L 21/02628* (2013.01); *H01L 51/0048* (2013.01); *B82Y 10/00* (2013.01); *H01L 29/127* (2013.01); *H01L 29/0673* (2013.01); *H01L 29/0676* (2013.01); *H01L 29/1606* (2013.01); *H01L 51/0566* (2013.01);
(Continued)

(58) Field of Classification Search
USPC ...................... 257/26; 438/478; 977/932, 844
See application file for complete search history.

(56) References Cited

U.S. PATENT DOCUMENTS 7,931,683 B2 * 4/2011 Weber et al. .................. 623/1.42
2009/0175757 A1 * 7/2009 Yao et al. ........................ 422/4

OTHER PUBLICATIONS

M. Gratzel Dye-sensitized solar cells, Journal of Photochemistry and Photobiology C: Photochemistry Reviews 2003, 4, 145-153.
(Continued)

*Primary Examiner* — Jami M Valentine
(74) *Attorney, Agent, or Firm* — Ella Cheong Hong Kong; Sam T. Yip

(57) ABSTRACT

The presently claimed invention provides a highly conductive composite used for electric charge transport, and a method for fabricating said composite. The composite comprises a plurality of one-dimensional semiconductor nanocomposites and highly conductive nanostructures, and the highly conductive nanostructures are incorporated into each of the one-dimensional semiconductor nanocomposite. The composite is able to provide fast electric charge transport, and reduce the rate of electron-hole recombination, ultimately increasing the power conversion efficiency for use in solar cell; provide fast electrons transport, storage of electrons and large surface area for adsorption and reaction sites of active molecular species taking part in photocatalytic reaction; enhance the sensitivity of a surface for biological and chemical sensing purposes for use in biological and chemical sensors; and lower the impedance and increase the charge storage capacity of a lithium-ion battery.

20 Claims, 13 Drawing Sheets

(51) Int. Cl.

| | |
|---|---|
| B82Y 99/00 | (2011.01) |
| H01L 21/02 | (2006.01) |
| H01L 51/00 | (2006.01) |
| B82Y 10/00 | (2011.01) |
| H01L 29/12 | (2006.01) |
| H01L 29/16 | (2006.01) |
| H01L 51/05 | (2006.01) |
| H01M 4/131 | (2010.01) |
| H01M 4/485 | (2010.01) |
| H01M 4/66 | (2006.01) |
| H01M 10/052 | (2010.01) |

(52) U.S. Cl.
CPC ............ *H01M 4/131* (2013.01); *H01M 4/485* (2013.01); *H01M 4/666* (2013.01); *H01M 10/052* (2013.01); *Y10S 977/932* (2013.01); *Y10S 977/844* (2013.01)
USPC ............ 257/26; 438/478; 977/932; 977/844

(56) References Cited

OTHER PUBLICATIONS

B. O'Reagan et al. A Low-Cost, High-Efficiency Solar Cell Based on Dye-Sensitized Colloidal TiO(2) Films, Nature, Oct. 24, 1991, 353, 737-740.

M. Law et al. Nanowire dye-sensitized solar cells, Nature materials 2005, vol. 4, 455-459.

A. Yella et al. Porphyrin-Sensitized Solar Cells with Cobalt (II/III)-Based Redox Electrolyte Exceed 12 Percent Efficiency, Science 2011, vol. 334, 629-634.

S. H. Kang et al. Nanorod-Based Dye-Sensitized Solar Cells with Improved Charge Collection Efficiency, Advanced Materials 2008, 20, 54-58.

L. Yang et al. Application of a Bilayer TiO2 Nanofiber Photoanode for Optimization of Dye-Sensitized Solar Cells, Advanced Materials 2011, 23, 4559-4562.

O. K. Varghese et al. Long vertically aligned titania nanotubes on transparent conducting oxide for highly efficient solar cells, Nature Nanotechnology 2009, vol. 4, 592-597.

T. Krishnamoorthy et al. A first report on the fabrication of vertically aligned anatase TiO2 nanowires by electrospinning: Preferred architecture for nanostructured solar cells, Energy & Environmental Science 2011, 4, 2807-2812.

N. Yang et al. Two-Dimensional Graphene Bridges Enhanced Photoinduced Charge Transport in Dye-Sensitized Solar Cells, ACS Nano 2010, vol. 4, 887-894.

K-M. Lee et al. Incorporating carbon nanotube in a low-temperature fabrication process for dye-sensitized TiO2 solar cells, Solar Energy Materials & Solar Cells 2008, 92, 1628-1633.

A, Kongkanand et al. Single Wall Carbon Nanotube Scaffolds for Photoelectrochemical Solar Cells. Capture and Transport of Photogenerated Electrons, Nano Letters 2007, vol. 7, No. 3, 676-680.

X. Dang et al. Virus-templated self-assembled single-walled carbon nanotubes for highly efficient electron collection in photovoltaic devices, Nature Nanotechnology 2011, vol. 6, 377-384.

P. Brown et al. Single-Walled Carbon Nanotube Scaffolds for Dye-Sensitized Solar Cells, The Journal of Physical Chemistry C 2008, vol. 112, No. 12, 4776-4782.

M. W. Marshall et al. Measurement of functionalised carbon nanotube carboxylic acid groups using a simple chemical process, Carbon 2006, vol. 44, 1137-1141.

S-R. Jang et al. Incorporation of Functionalized Single-Wall Carbon Nanotubes in Dye-Sensitized TiO2 Solar Cells, Langmuir 2004, 20, 9807-9810.

X. Zhao et al. Carbon Nanowire Made of a Long Linear Carbon Chain Inserted Inside a Multiwalled Carbon Nanotube, Physical Review Letters 2003, vol. 90, No. 18, 187401.

V. Scuderi et al. Direct observation of the formation of linear C chain/carbon nanotube hybrid systems, Carbon 2009, vol. 47, 2134-2137.

\* cited by examiner

HIGHLY CONDUCTIVE NANO-STRUCTURES INCORPORATED IN SEMICONDUCTOR NANOCOMPOSITES

CROSS REFERENCE TO RELATED APPLICATION

Pursuant to 35 U.S.C. §119(e), this is a non-provisional patent application which claims benefit from U.S. provisional patent application Ser. No. 61/735,068 filed Dec. 10, 2012, and the disclosure of which is incorporated herein by reference.

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

The present invention relates to a nanocomposite, and particularly relates to a carbon-based nanocomposite. The present invention also relates to a preparation method for forming said nanocomposite to improve functional applications.

BACKGROUND

There is a never ending search for advanced materials. Many of these advanced materials are composite materials. Composites are formed when various distinct materials are engineered together to create a new material. The idea is to take best advantage of the strengths of each component material complementing their weaknesses. Composites may be engineered with unique properties to suit very distinct applications such as solar cell, catalyst, sensor, or electronic device. An important property that has been frequently investigated is electrical conductivity. In different applications, there is always a strong demand to employ a composite material having superior electrical conductivity. One of the outstanding examples is dye sensitized solar cell (DSSC).

DSSC based on mesoporous $TiO_2$ is a promising low-cost, high-efficiency photovoltaic device for solar energy conversion. To-date, a power conversion efficiency (PCE) of 15% has been obtained. Despite this, further improvement is necessary for DSSC to compete with silicon-based solar cells.

In a conventional DSSC, a monolayer of molecular dye is adsorbed at the surface of a mesoporous wide band-gap semiconductor oxide film, such as $TiO_2$, or ZnO. However, electron transport in nanoparticle-based device is limited by a trap-limited diffusion process. The slow charge diffusion increases the probability of recombination, resulting in lower efficiency. Moreover, the grain boundaries encountered during electron transport lead to fast recombination prior to their collection at the electrode. Much effort has been devoted to improve charge transport property and collection efficiency.

One promising solution is to use a one-dimensional (1-D) nanostructure photoanode to replace the nanoparticle film, which provides a direct pathway for collection of charges generated throughout the device. Electron transport in 1-D nanostructures, such as nanowires, nanofibers, nanorice (elongated 1-D structure with two ends having smaller diameter compared to rest of the structure) or nanorods, is expected to be several orders of magnitude faster than that of nanoparticles. Another approach to improve the electron transport and collection is by incorporating highly electrically conductive materials, such as carbon tubes, graphite, in titanium photoanode. The presence of conductive materials in a titanium photoanode is expected to improve the charge transport properties and extend the electron lifetime, thereby improving the performance of the device. Several groups have reported that utilizing nanocomposite photoanodes, such as titanium/carbon nanotubes, and titanium/graphene, can enhance electron transport and collection efficiency.

Electron transport in two architectures of nanocomposites in prior arts are depicted in FIGS. 1A and 1B.

As shown in FIG. 1A, carbon nanotubes (CNTs) 101 are totally surrounded or embraced by $TiO_2$ nanoparticles 102. At first, electron-hole pairs are firstly generated in the $TiO_2$ nanoparticles 102 under light excitation, and the electrons 103 migrate towards the CNTs 101 from the $TiO_2$ nanoparticles 102. Electron transfer routes 104 within and across the $TiO_2$ nanoparticles 102 are shown by curly arrows. Once the electrons 103 arrive at the CNTs 101, acting as direct-charge transport superhighways, the electrons 101 are rapidly transferred towards fluorine doped tin oxide (FTO) glass 105 due to the superior conductivity of the CNTs 101. Direct electron transfer routes 106 within the CNTs 101 are shown by straight arrows.

As shown in FIG. 1B, the CNTs 101 are totally surrounded or embraced by $TiO_2$ nanorods 107. Similarly, electron-hole pairs are firstly generated in the $TiO_2$ nanorods 107 under light excitation, and the electrons 103 migrate towards the CNTs 101 from the $TiO_2$ nanorods 107. The electron transfer routes 104 within and across the $TiO_2$ nanorods 107 are shown by thinner straight arrows. Once the electrons 103 arrive at the CNTs 101, the electrons 103 are rapidly transferred towards the FTO glass 105 due to the superior conductivity of the CNTs 101. The direct electron transfer routes 106 within the CNTs 101 are shown by straight arrows.

However, regarding the two fore-mentioned architectures in the prior arts, the electron transfer routes for the generated electrons to travel from the generation sites to the CNTs are long and many electrons are susceptible to recombine with the holes (in case of solid-state DSSC) and electrolytes (in case of liquid DSSC) on their routes to the FTO glass electrode, leading to decrease of the power conversion efficiency. For the first architecture, the electrons are easily recombined with the holes in the hole transfer materials (HTM) for solid-state DSSC or oxidized electrolytes for the liquid DSSC at the grain boundaries of the $TiO_2$ nanoparticles. Also, the $TiO_2$ nanoparticles are loosely attached with each others, thus extending significantly the electron transfer routes. For the second architecture, the electrons are also easily recombined with the holes or electrolytes at the grain boundaries of the $TiO_2$ nanorods and at exposed areas of CNT not fully covered with nanorods. Similarly, the $TiO_2$ nanorods are loosely attached with each other, thus extending significantly the electron transfer routes.

Additionally, the $TiO_2$ nanoparticles, or the $TiO_2$ nanorods are loosely attached on the CNTs, leading to limited amount of electrical contact surface areas between the CNTs and the $TiO_2$ nanoparticles or the $TiO_2$ nanorods, thereby reducing electron transfer rate and increasing the exposure of CNT to the holes in HTM and oxidized electrolytes which increases also the probability of the electron-hole recombination.

Consequently, there is an unmet need for a nanocomposite which is effective in providing fast electric charge transport, and reducing the rate of electron-hole recombination, ultimately increasing power conversion efficiency.

SUMMARY OF THE INVENTION

Accordingly, a first aspect of the presently claimed invention is to provide a highly conductive composite.

In accordance with an embodiment of the presently claimed invention, a composite comprises a plurality of one-dimensional semiconductor nanocomposites, wherein each of the one-dimensional semiconductor nanocomposites comprises: one or more semiconductor media; and one or more highly conductive nanostructures; wherein the one or more highly conductive nanostructures are dispersed within the each of the one-dimensional semiconductor nanocomposites, and are covered substantially by and interfacially bonded to the one or more semiconductor media, leading to improved electrical conductivity of the one-dimensional semiconductor nanocomposite.

Preferably, the one-dimensional semiconductor nanocomposite is in a structure selected from the group consisting of nanorod, nanowire, nanofiber, and nanorice. Material of the one or more highly conductive nanostructures is carbon-based, gold, silver, aluminum, zinc, nickel, platinum, or tin. The one or more highly conductive nanostructures are selected from the group consisting of single-wall carbon nanotubes, multi-wall carbon nanotubes, carbon nanorods, carbon nanowires, graphene sheets, and their combinations. The composite comprises 2 to 10 percent by weight of the highly conductive nanostructures. Preferably, the composite comprises 2 to 6 percent by weight of the highly conductive nanostructures.

A second aspect of the presently claimed invention is to provide a method for fabricating the composite.

In accordance with an embodiment of the presently claimed invention, a method for fabricating said composite, comprising the steps of: preparing a semiconductor precursor solution; adding a plurality of highly conductive nanostructures to the semiconductor precursor solution to form a solution; producing a plurality of preformed one-dimensional semiconductor nanocomposites with the solution; heating up the plurality of the preformed one-dimensional semiconductor nanocomposites with a temperature rise rate having a range from 0.1° C./min to 5° C./min until reaching a calcination temperature having a range from 200° C. to 1000° C.; calcinating the plurality of the preformed one-dimensional semiconductor nanocomposites with the calcination temperature for a calcination period; and cooling down the plurality of the preformed one-dimensional semiconductor nanocomposites from the calcination temperature at a temperature decreases rate having a range from −0.1° C./min to −5° C./min until formation of the composite.

Preferably, the temperature rise rate has a range from 0.1° C./min to 3° C./min. The temperature decrease rate has a range from −0.1° C./min to −3° C./min. The calcination temperature has a range from 300° C. to 600° C. The solution comprises 0.05 to 0.15 percent by weight of the highly conductive nanostructures.

A third aspect of the presently claimed invention is to provide a highly conductive nanocomposite.

In accordance with an embodiment of the presently claimed invention, a one-dimensional semiconductor nanocomposite comprises: one or more semiconductor media; and one or more highly conductive nanostructures; wherein the one or more highly conductive nanostructures are dispersed within the one-dimensional semiconductor nanocomposite, and are covered substantially by and interfacially bonded to the one or more semiconductor media, leading to improved electrical conductivity of the one-dimensional semiconductor nanocomposite.

A fourth aspect of the presently claimed invention is to provide a method for fabricating the one-dimensional semiconductor nanocomposite.

In accordance with an embodiment of the presently claimed invention, a method for fabricating said one-dimensional semiconductor nanocomposite comprises the steps of: preparing a semiconductor precursor solution; adding a plurality of highly conductive nanostructures to the semiconductor precursor solution to form a solution; producing a preformed one-dimensional semiconductor nanocomposite with the solution; heating up the preformed one-dimensional semiconductor nanocomposites with a temperature rise rate having a range from 0.1° C./min to 5° C./min until reaching a calcination temperature having a range from 200° C. to 1000° C.; calcinating the plurality of the preformed one-dimensional semiconductor nanocomposites with the calcination temperature for a calcination period; and cooling down the preformed one-dimensional semiconductor nanocomposites form the calcination temperature until formation of said nanocomposite.

Unlike the traditional nanocomposite used for DSSC, the nanocomposite of the presently claimed invention provides several advantages. The configuration of the nanocomposite of the presently claimed invention is able to improve charge transfer in the semiconductor photoanode once an electron is injected there from the sensitzied dye, and reduce the loss of electrons from recombination with the oxidized dye and with electrolyte (liquid), or holes (solid-state). Furthermore, the carbon-based nanostructure is able to act as an electron reservoir for electron storage. The nanocomposite of the present invention and the method for fabricating said nanocomposite are applicable to solar cell, photocatalyst, nano-transistor, chemical sensor, biological sensor, humidity sensor, or lithium-ion battery.

BRIEF DESCRIPTION OF THE DRAWINGS

Embodiments of the present invention are described in more detail hereinafter with reference to the drawings, in which.

DETAILED DESCRIPTION OF PREFERRED EMBODIMENTS

In the following description, semiconductor nanocomposites incorporated with highly conductive nanostructures, and methods for fabricating said semiconductor nanocomposites are set forth as preferred examples. It will be apparent to those skilled in the art that modifications, including additions and/or substitutions, may be made without departing from the scope and spirit of the invention. Specific details may be omitted so as not to obscure the invention; however, the disclosure is written to enable one skilled in the art to practice the teachings herein without undue experimentation.

Figure 1A:
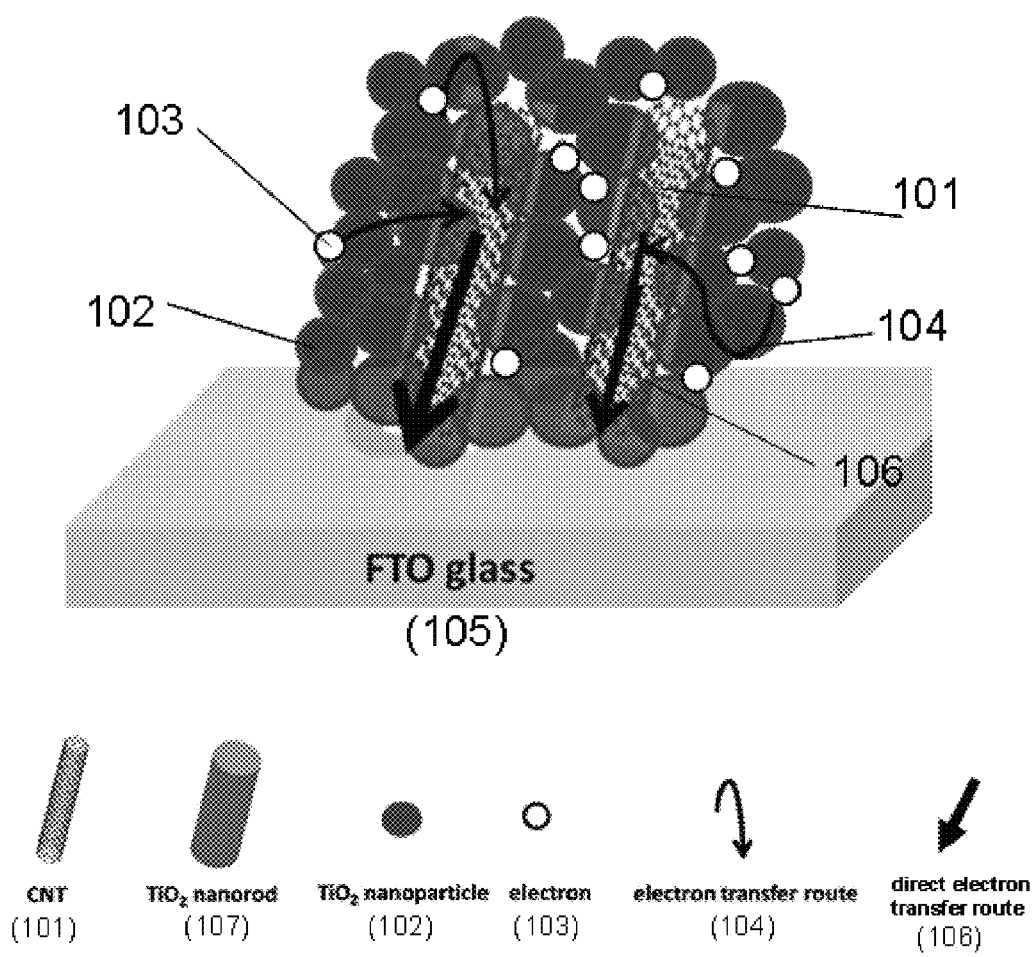
FIGS. 1A and 1B are schematic diagrams depicting electron transport in two architectures of nanocomposites in prior arts respectively.
Figure 1B:
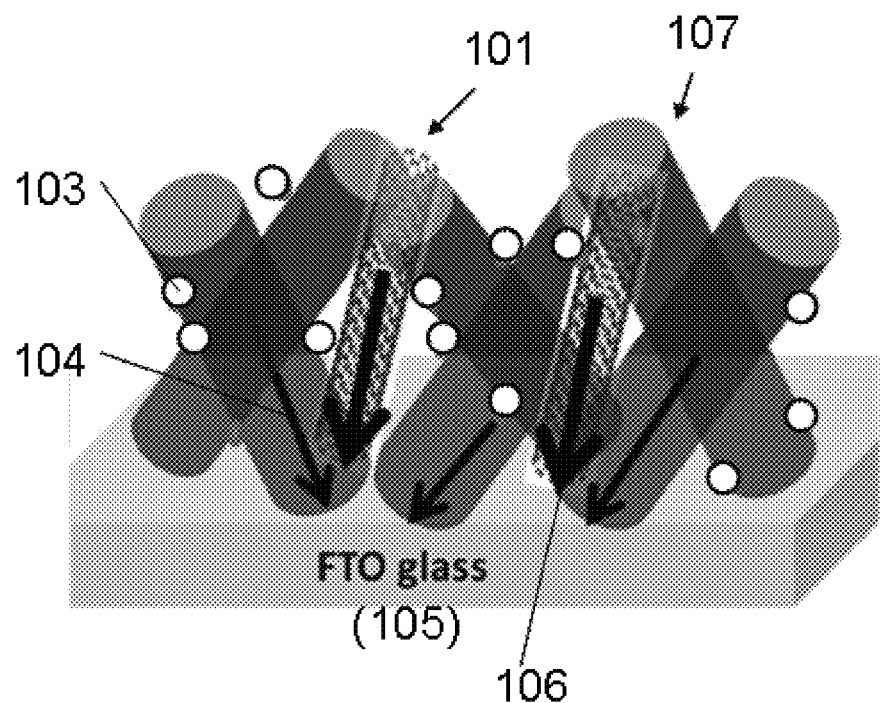
Figure 1C:
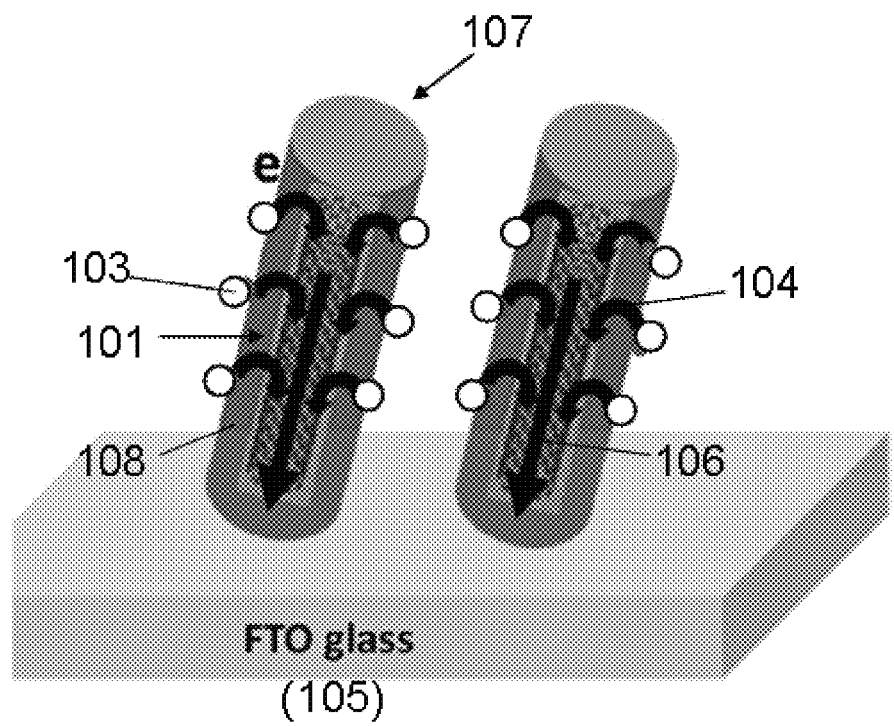
FIG. 1C is a schematic diagram depicting electron transport in an architecture of a composite according to an embodiment of the presently claimed invention.

FIG. 1C is a schematic diagram depicting electron transport in an architecture of a composite according to an embodiment of the presently claimed invention. The composite comprises the $TiO_2$ nanorods 107 and the CNTs 101. The $TiO_2$ nanorods 107 extend substantially throughout the volume of the composite. Each of the $TiO_2$ nanorods 107 comprises a semiconductor medium 108. The semiconductor medium 108 can be either crystalline and/or amorphous. For example, $TiO_2$ present in three possible crystalline phases—anatase, rutile, and brookite, while ZnO is known to exist in two crystalline phases—hexagonal wurtzite and cubic zincblende. $SiO_2$ presents in both crystalline form (quartz) and amorphous form (glass). On the other hand, amorphous polymeric semiconductors are quite common as well. A plurality of the CNTs 101 is incorporated inside each of the $TiO_2$ nanorods 107. The CNTs 101 are dispersed within each of the $TiO_2$ nanorods 107, and are covered substantially by, and interfacially bonded to semiconductor medium 108, leading to have electrical contact to the semiconductor medium 108.

Under illumination, electron-hole pairs are generated, and the electrons 103 migrate towards the CNTs 101 through the semiconductor medium 108 of the $TiO_2$ nanorods 107. The electron transfer routes 104 within the semiconductor medium 108 are shown by curly arrows. Once the generated electrons arrive at the CNTs 101, serving as direct-charge transport subways, the electrons 103 are rapidly transferred towards the FTO glass 105 within the CNTs 101. The architecture of the composite of the presently claimed invention is able to reduce the lengthy electron transfer routes 104, and increasing the chance of using the direct electron transfer routes 106 within the CNTs 101, having much effective electron transport capability, thereby speeding up the electron transport. As the generated electrons are transferred towards the FTO glass 105 within a short period, the probability of electron-hole recombination is substantially reduced.

Figure 2A:
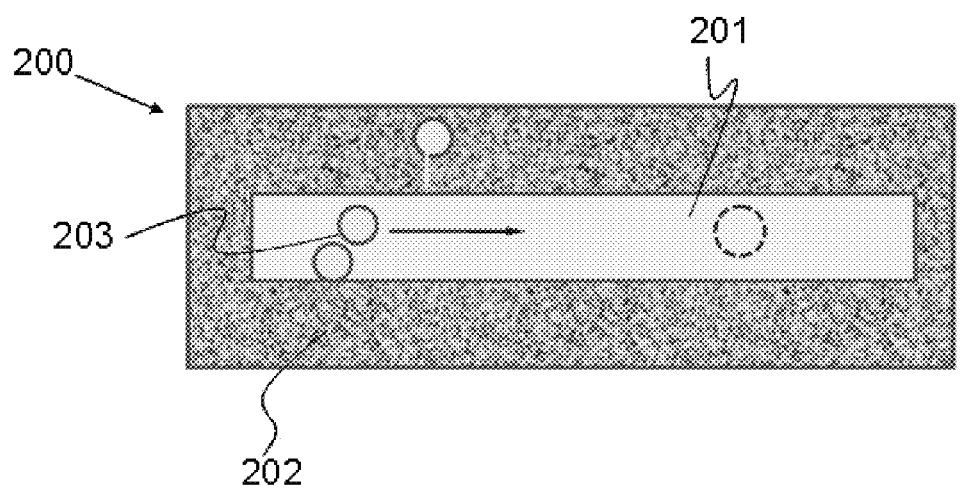
FIG. 2A is a schematic diagram depicting electron transport in an architecture of a nanocomposite with a magnified view according to an embodiment of the presently claimed invention.

FIG. 2A is a schematic diagram depicting electron transport in an architecture of a nanocomposite with a magnified view according to an embodiment of the presently claimed invention. A carbon-based nanostructure 201 is incorporated within a semiconductor nanorod 200, and is covered substantially by, and interfacially bonded to a semicondictor medium 202. Upon excited by light, electrons 203 are generated by the sensitized dye (not shown), and they are injected to the conduction band of the semiconductor nanorod 200, and subsequently transferred into the carbon-based nanostructure 201 through the semiconductor medium 202. Because of the superior conductivity of the carbon-based nanostructure 201, electrons 203 are rapidly transferred towards a positive terminal (not shown in FIG. 2A). Preferably, the carbon-based nanostructure 201 includes but not limited to a CNT, carbon nanorod, carbon nanowire, graphene sheet. In addition, the semiconductor nanorod 202 can be a $TiO_2$ nanorod, or a $TiO_2$ nanofiber. A plurality of the carbon-based nanostructures with different nanostrctures can be incorporated into the semiconductor nanorod 202

Figure 2B:
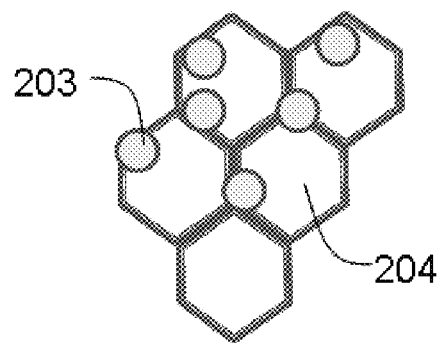
FIG. 2B is a schematic diagram showing a magnified view of the carbon-based nanostructure of FIG. 2A.

FIG. 2B is a schematic diagram showing a magnified view of the carbon-based nanostructure of FIG. 2A. The carbon-based nanostructure comprises carbon atoms arranged in several regularly hexagonal patterns 204, which is able to store a large number of electrons 203, and serves as an electron reservoir.

Figure 3:
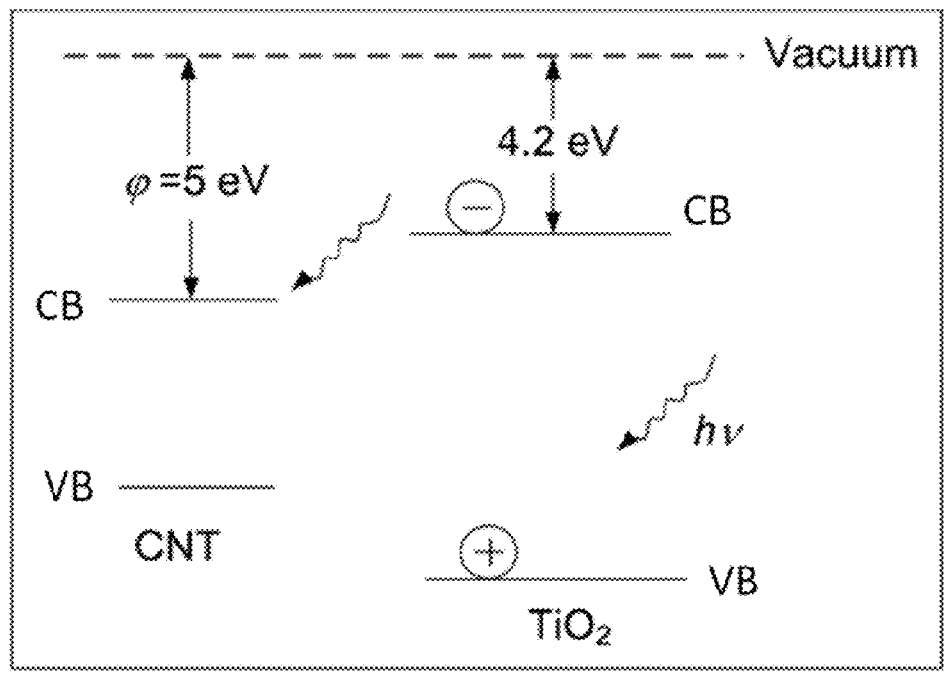
FIG. 3 is a schematic diagram showing a band gap diagram of a $TiO_2$/CNT nanocomposite according to an embodiment of the presently claimed invention.

FIG. 3 is a schematic diagram showing a band gap diagram of a $TiO_2$/CNT nanocomposite according to an embodiment of the presently claimed invention. Upon irradiation, electrons generated from the sensitized dye are injected into the conduction band of the $TiO_2$. The photogenerated electrons quickly move to CNT array whereas the separated holes are left behind in $TiO_2$. This process creates separation of the electron-hole pairs, thereby reducing the chance of the electron-hole recombination and increasing the photocurrent response.

Figure 4A:
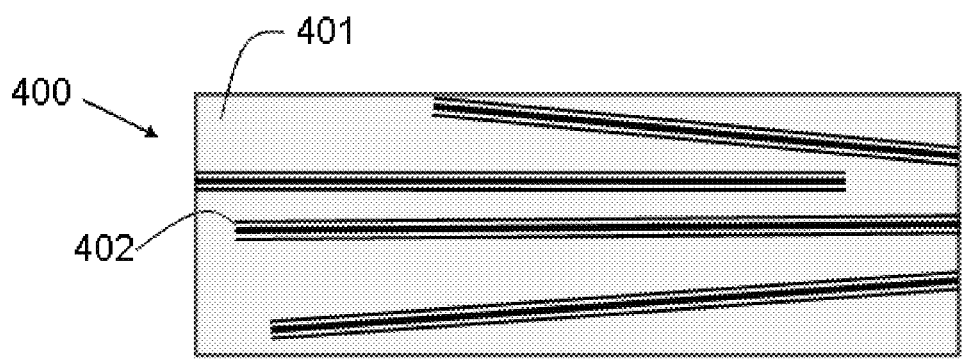
FIG. 4A-C are schematic diagrams showing a first, a second and a third exemplary embodiments of three configurations of nanocomposites according to the presently claimed invention.

FIG. 4A shows a first exemplary embodiment of a configuration of a nanocomposite according to the presently claimed invention. The nanocomposite comprises a one-dimensional semiconductor 400, and a plurality of CNTs 402. The CNTs 402 are incorporated within the one-dimensional semiconductor 400, and surrounded by the crystalline and/or amorphous semiconductor medium 401 of the one-dimensional semiconductor 401. The CNTs 402 can be single-wall and/or multi-wall.

Figure 4B:
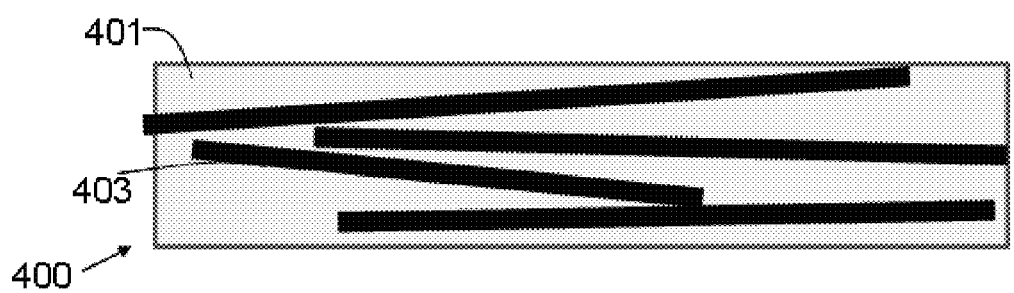

FIG. 4B show a second exemplary embodiment of the configuration of the nanocomposite according to the presently claimed invention. The nanocomposite comprises the one-dimensional semiconductor 400, and a plurality of carbon nanowires 403. The carbon nanowires 403 are incorporated within the one-dimensional semiconductor 400, and surrounded by the semiconductor medium 401 of the one-dimensional semiconductor 400. The carbon nanowires 403 can be replaced by carbon nanorods. Alternatively, both the carbon nanowires 403 and the carbon nanorods can be incorporated within the one-dimensional semiconductor 400.

Figure 4C:
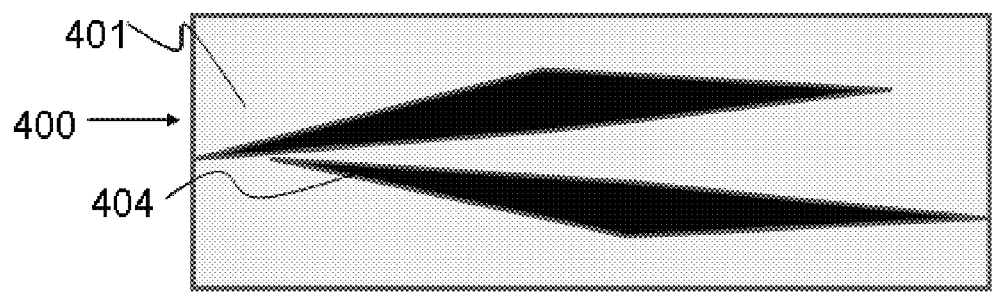

FIG. 4C show a third exemplary embodiment of the configuration of the nanocomposite according to the presently claimed invention. The nanocomposite comprises the one-dimensional semiconductor 400, and a plurality of graphene sheets 404. The graphene sheets 404 are incorporated within the one-dimensional semiconductor 400, and surrounded by the semiconductor medium 401 of the one-dimensional semiconductor 400.

Preferably, the one-dimensional semiconductor 400 is a semiconductor nanorod, semiconductor nanofiber, or semiconductor nanowire.

Figure 5:
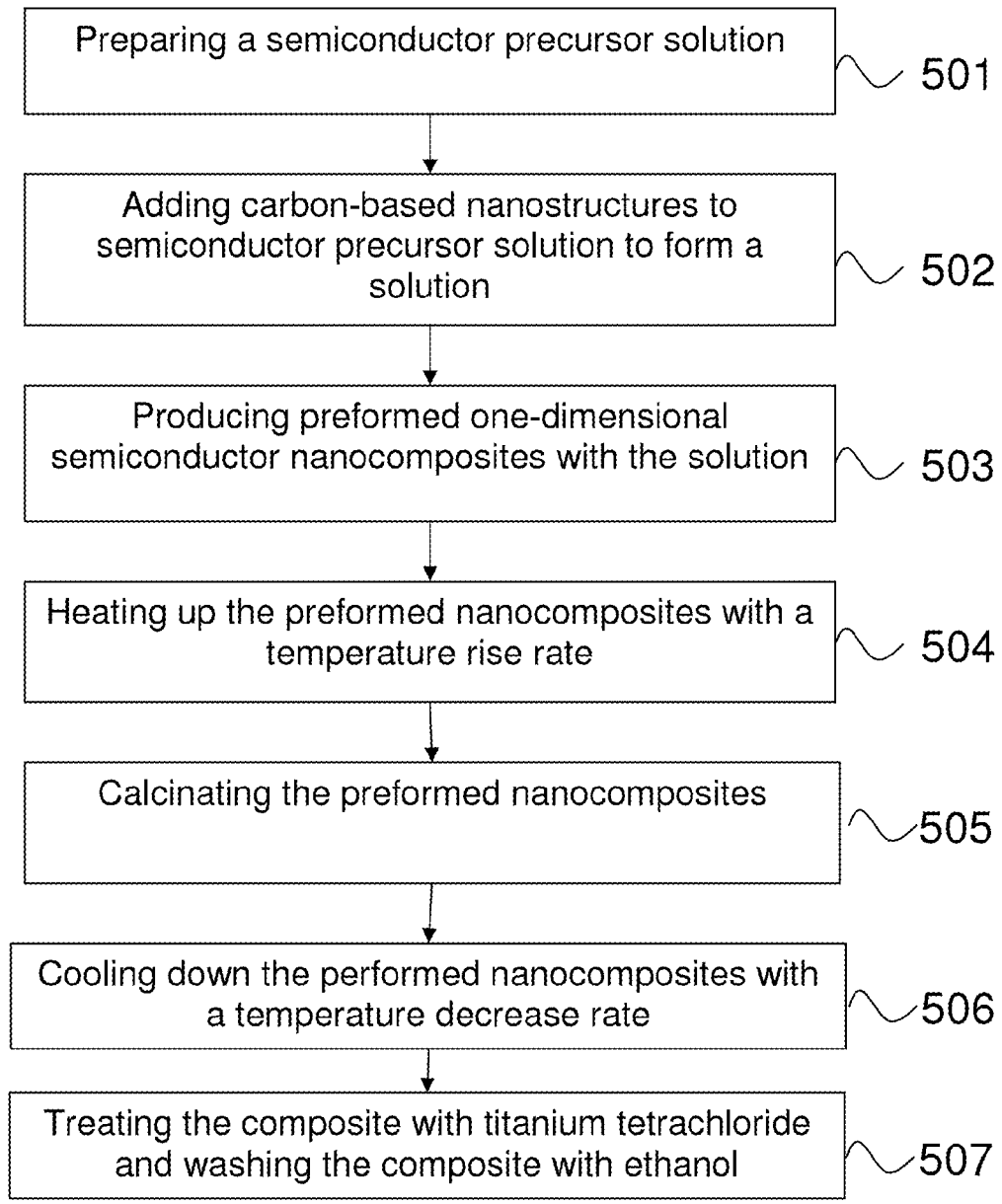
FIG. 5 is a flow chart illustrating the steps of a method for fabricating a carbon-based composite according to an embodiment of the presently claimed invention.

FIG. 5 is a flow chart illustrating the steps of a method for fabricating a carbon-based composite according to an embodiment of the presently claimed invention. In step 501, a semiconductor precursor solution is prepared. In step 502, carbon-based nanostructures are added and dissolved in the semiconductor precursor solution. In step 503, a plurality of preformed one-dimensional semiconductor nanocomposites incorporated with the carbon-based nanostructures is produced by an electrospinning method. Preferably, the solution is electrospun by applying a high voltage over a collector distance to produce the preformed one-dimensional semiconductor nanocomposites. In step 504, the preformed one-dimensional semiconductor nanocomposites are heated up in an oven by a temperature rise rate ranging of 0.1° C./min to 5° C./min until reaching a calcination temperature ranging of 200° C. to 1000° C. to remove both organic and aqueous phases. In step 505, the preformed one-dimensional semiconductor nanocomposites are calcinated at the calcination temperature for a calcination period. In step 506, the preformed one-dimensional semiconductor nanocompositess are cooled down from the calcination temperature at a temperature decreases rate having a range from −0.1° C./min to −5° C./min until formation of the composite, which comprises a plurality of one-dimensional semiconductor nanocomposites. The structure of the one-dimensional semiconductor nanocomposite after calcination may be different from that of the preformed one-dimensional semiconductor nanocomposite before calcination. In step 507, the composite is treated with titanium tetrachloride and further washed with ethanol.

In step 503, the preformed one-dimensional semiconductor nanocomposite can be fabricated by a solution method, or a chemical method.

Due to different thermal expansion coefficients between the preformed one-dimensional semiconductor nanocomposites (e.g. nanofibers) and the carbon-based nanostructures containing therein, leading to differential expansion between the semiconductor and the carbon-based nanostructure, the preformed one-dimensional semiconductor nanocomposites (e.g. nanofibers) are easily broken up into a plurality of shorter, length-wise one-dimensional semiconductor nanocomposites (e.g. nanorods) during the calcination process due to stress caused by differential expansion (during heating) and differential contraction (during cooling). As the size of the one-dimensional semiconductor nanocomposites is significantly smaller than that of the preformed one-dimensional semiconductor nanocomposites, the one-dimensional semiconductor nanocomposites can be more tightly packed, leading to increase electrical contact among the one-dimensional semiconductor nanocomposites, thus enhancing the electrical conductivity of the composite ultimately formed.

In addition, it is found through extensive testing that controlling correctly the temperature rise rate and the temperature decrease rate is a key factor to preserve the integrity of the finally obtained composite, otherwise too sudden change in temperature causes "cracks" in the composite that deteriorate its function, ultimately affecting the performance of the device.

Hence the preferable ranges of the temperature rise rate and the temperature decrease rate during calcinating the preformed one-dimensional semiconductor composite are from 0.1° C./min to 3° C./min, and from −0.1° C./min to −3° C./min respectively.

In addition, the calcination temperature is also a key factor to preserve the suitable phase of semiconductor. For example, when the calcinations temperature exceeds 600° C., an increasing fraction of $TiO_2$ exists as rutile phase rather than the more desirable anatase phase for use in dye sensitized solar cells.

Accordingly, the preferable range of the calcination temperature is between 300° C. and 600° C., which work generally for most semiconductors.

Preferably, the solution in step 502 comprises 0.05 to 0.15 wt % of the carbon-based nanostructures.

Alternatively, a sole one-dimensional semiconductor nanocomposite can be fabricated by the above method. Simply, a single preformed one-dimensional semiconductor nanocomposite is produced in step 503.

Accordingly, the present invention is not limited to employ the carbon-based nanostructures. Other highly conductive nanostructures can be employed. The materials of the highly conductive nanostructures are listed in Table 1.

TABLE 1

| Material | σ (S/m) at 20° C. |
|---|---|
| Carbon (graphene) | $1.0 \times 10^8$ |
| Silver | $6.30 \times 10^7$ |
| Copper | $5.96 \times 10^7$ |
| Annealed copper | $5.80 \times 10^7$ |
| Gold | $4.10 \times 10^7$ |
| Aluminium | $3.5 \times 10^7$ |
| Calcium | $2.98 \times 10^7$ |
| Tungsten | $1.79 \times 10^7$ |
| Zinc | $1.69 \times 10^7$ |
| Nickel | $1.43 \times 10^7$ |
| Lithium | $1.08 \times 10^7$ |
| Iron | $1.00 \times 10^7$ |
| Carbon Nanotubes (Single/multiple walls) | $10^6$-$10^7$ |
| Platinum | $9.43 \times 10^6$ |
| Tin | $9.17 \times 10^6$ |
| Carbon steel (1010) | $6.99 \times 10^6$ |
| Lead | $4.55 \times 10^6$ |
| Titanium | $2.38 \times 10^6$ |
| Grain oriented electrical steel | $2.17 \times 10^6$ |
| Manganin | $2.07 \times 10^6$ |
| Constantan | $2.04 \times 10^6$ |

TABLE 1-continued

| Material | σ (S/m) at 20° C. |
|---|---|
| Stainless steel | $1.45 \times 10^6$ |
| Mercury | $1.02 \times 10^6$ |
| Nichrome | $9.09 \times 10^5$ |
| Titanium dioxide | $4.0 \times 10^5$ |
| Zinc Oxide | $0.33 \times 10^5\text{-}2 \times 10^5$ |
| GaAs | $5 \times 10^{-8}$ to $10^3$ |
| Carbon (amorphous) | $1.25 \times 10^3$ to $2 \times 10^3$ |
| Carbon (graphite) | $2 \times 10^5$ to $3 \times 10^5$ //basal plane $3.3 \times 10^2$ ⊥ basal plane |
| Carbon (diamond) | $\sim 10^{-13}$ |
| Germanium | 2.17 |
| Sea water | 4.8 |
| Drinking water | $5 \times 10^{-4}$ to $5 \times 10^{-2}$ |

Conductivity is measured by Siemens per meter (S/m). Superconductive material is theoretically infinite. Conductive metals are in the range of $10^8$ S/m. On the other hand, conductivity for semiconductor such as $TiO_2$ is only $4 \times 10^5$ S/m and for ZnO, it is $0.33 \times 10^5\text{-}2 \times 10^5$ S/m. Therefore, it would be useful if highly conductive materials can be inserted in the semiconductor to improve electron transfer and reduce electron-hole recombination.

In the present invention, the method has been developed of inserting highly conductive materials in the one-dimensional semiconductor nanocomposite such as CNT (single/multiple walls) with conductivity of $10^6\text{-}10^7$ S/m, or even graphene with one-atom (carbon) thick layer of graphite with conductivity of $10^8$ S/m. It is intended that this highly conductive materials, which are in form of a nanostructure, and present in the 1-D semiconductor nanocomposite, should have conductivity of at least $10^6$ S/m.

According to an embodiment of the present claimed invention, the composite comprises 2 to 10 percent by weight of the highly conductive nanostructures. Preferably, the composite comprises 2 to 6 percent by weight of the highly conductive nanostructures.

Example 1

$TiO_2$/PVP/MWCNT composite nanofibers were first electrospun on fluorine doped tin oxide (FTO) glass (15Ω per square) from a precursor solution that contained titanium isopropoxide (TIP, 4 g), polyvinylpyrrolidone (PVP, 3.5 g), acetic acid (2 g), MWCNT (0.05~0.15 g) and ethanol (100 mL). All materials were obtained from Sigma-Aldrich and used without further purification. The voltage of 70 kV was applied over a collector distance of 19 cm. A layer of $TiO_2$/MWCNT nanorods was peeled off from the original FTO glass after calcination and then transferred to another FTO glass with an ultra-thin adhesive $TiO_2$ paste. The $TiO_2$/MWCNT nanorod photoanode was obtained after calcinating at 450° C. for 2 h. The corresponding temperature rise rate was 1° C./min until reaching the calcination temperature of 450° C. The thickness of the photoanode was measured by a surface profiler (TENCOR P-10).

Before sensitization, the photoanode (3 mm×3 mm) was first treated with an aqueous solution of $TiCl_4$ (40 mM) at 60° C. for 15 min. After treatment, the photoanode was washed with ethanol and dried in vacuum at 80° C. Subsequently, it was immersed in a solution of 0.3 mM Ruthenium dye (N719) in absolute ethanol at 55° C. for 24 h. The soaked photoanode was then washed with ethanol to remove "unanchored" dye molecules and subsequently dried in vacuum at room temperature. Platinum-sputtered FTO glass was used as the counter electrode. The counter electrode and dye-anchored photoanode were assembled into a sandwich prototype with surlyn (DuPont, 25 μm). The internal space of the cell was filled with a liquid electrolyte, which consisted of 0.6 M 1-methyl-3-propylimidazolium iodide (PMII), 0.05 M LiI, 0.05 M $I_2$, and 0.5 M 4-tert-butyl pyridine (TBP) in acetonitrile.

The photovoltaic characterization was carried out by a Keithley 2400 digital source meter under illumination of AM1.5G 100 mW/cm² from a solar simulator ABET SUN 2000. The power density of the solar simulator was calibrated by a silicon reference cell (NIST) and monitored by a power meter throughout the testing. The external quantum efficiency (EQE) values were measured with an EQE system equipped with a xenon lamp (Oriel 66902, 300 W), a monochrometor (Newport 66902), a Si detector (Oriel 76175_71580) and a dual channel power meter (Newport 2931_C).

Figure 6A:
FIG. 6A is a SEM image of $TiO_2$ nanorods incorporating MWCNTs according to a first exemplary embodiment of the presently claimed invention.

FIG. 6A shows a SEM image of $TiO_2$ nanorods incorporating MWCNTs. The diameter of the $TiO_2$ nanorod is approximately 70 nm, and the length of the $TiO_2$ nanorods is of order of hundreds of nanometers to micrometers. Note that the MWCNT is not visible from the SEM image, which suggests that the MWCNTs are in the $TiO_2$ nanorods.

Figure 6B:
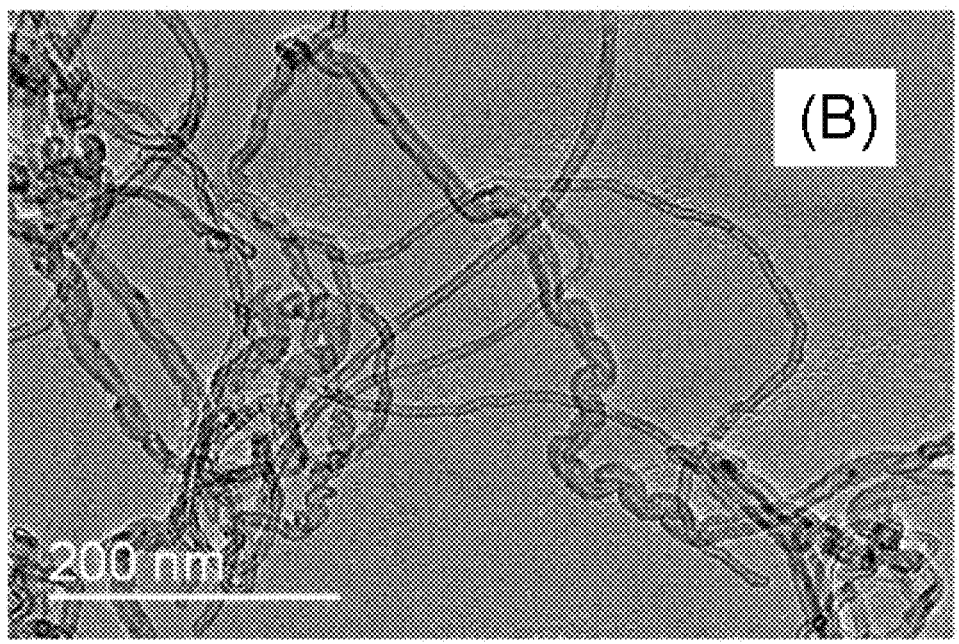
FIG. 6B is a transmission electron microscopy (TEM) image of MWCNTs according to the first exemplary embodiment of the presently claimed invention.
Figure 6C:
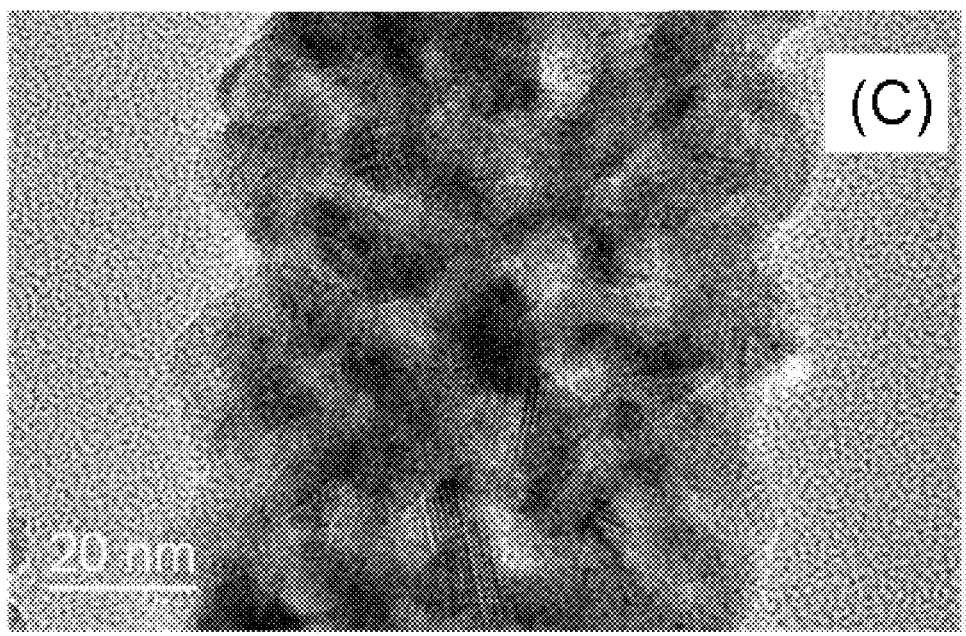
FIG. 6C is a TEM image of $TiO_2$ nanorods incorporating MWCNTs according to the first exemplary embodiment of the presently claimed invention.
Figure 6D:
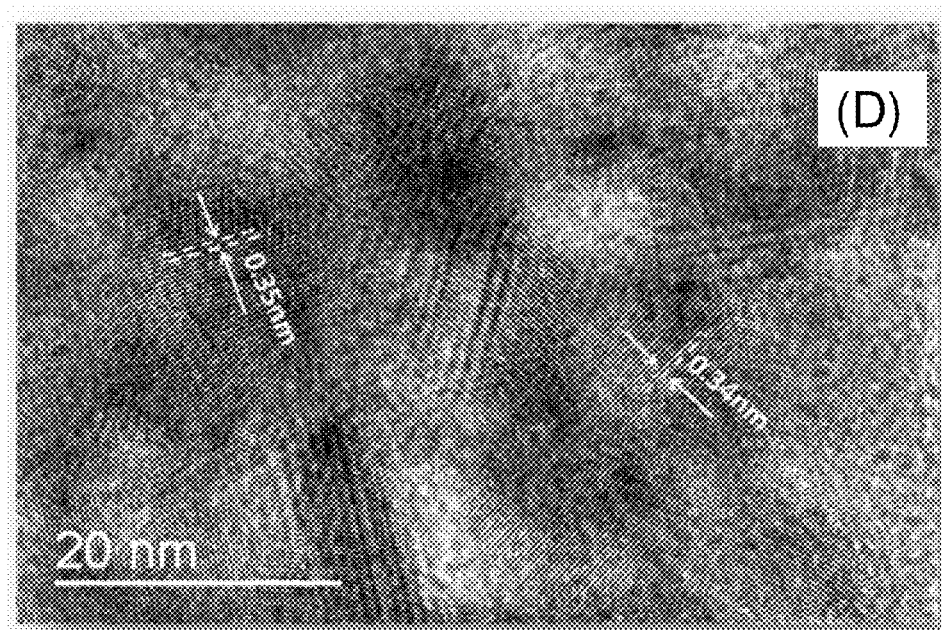
FIG. 6D is a high resolution transmission electron microscopy (HRTEM) image of $TiO_2$ nanorods incorporating MWCNTs according to the first exemplary embodiment of the presently claimed invention.

FIG. 6B-D shows the related TEM images. FIGS. 6B and 6C show TEM images of MWCNTs and $TiO_2$ nanorods incorporating MWCNTs. FIG. 6D shows a HRTEM image of $TiO_2$ nanorods incorporating MWCNTs. From the TEM image of MWCNTs (FIG. 6B), it can be seen that the outside diameter of the MWCNT ranges from 7 to 12 nm and the inside diameter is about 3 nm. The electrospun $TiO_2$ nanorods incorporating the MWCNTs exhibit clear crystal lattice fringes (FIGS. 6C and 6D). As shown in FIG. 6D, the crystal inter-planar spacing of the $TiO_2$ grains is about 0.35 nm corresponding to the (101) planes of the anatase phase. On the other hand, the crystal inter-planar spacing of 0.34 nm corresponds to the (002) plane of the MWCNT. The foregoing morphology analysis indeed confirmed that the MWCNTs were inside the $TiO_2$ nanorods.

Figure 6E:
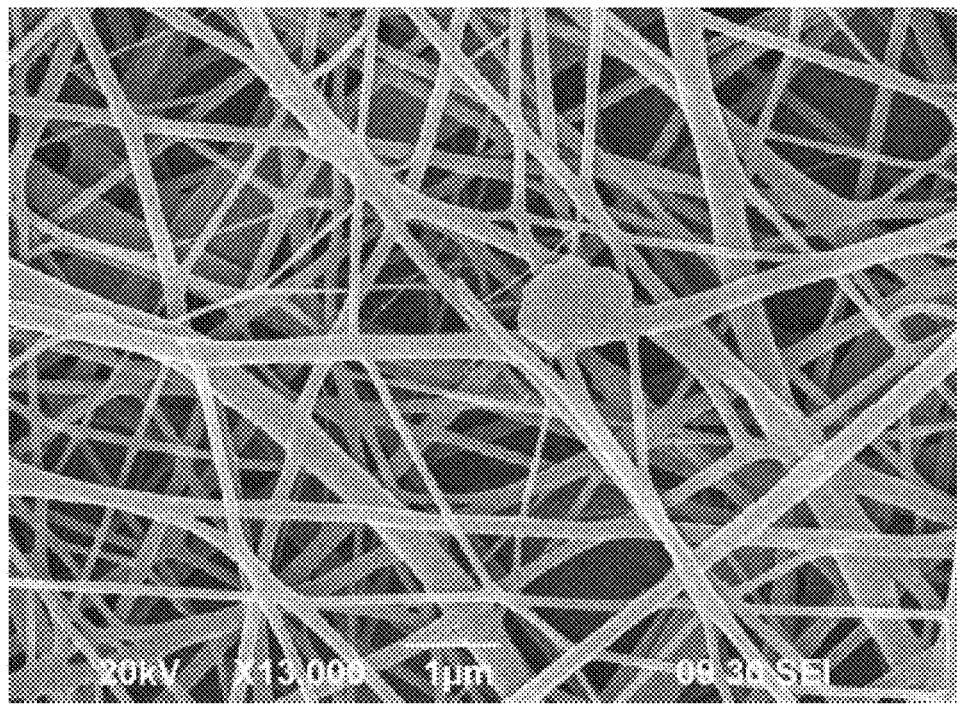
FIG. 6E is a SEM image of $TiO_2$ nanofiber before calcination according to the first exemplary embodiment of the presently claimed invention.

FIG. 6E shows a SEM image of $TiO_2$/MWCNTs nanofibers before calcination. Comparing with FIG. 6A, $TiO_2$/MWCNTs nanofibers regarding as the preformed state, are much longer in length than that of $TiO_2$/MWCNTs nanorods. It illustrates that the $TiO_2$/MWCNTs nanofibers were broken up into a plurality of shorter, length-wise, $TiO_2$/MWCNTs nanorods during calcination.

Figure 7:
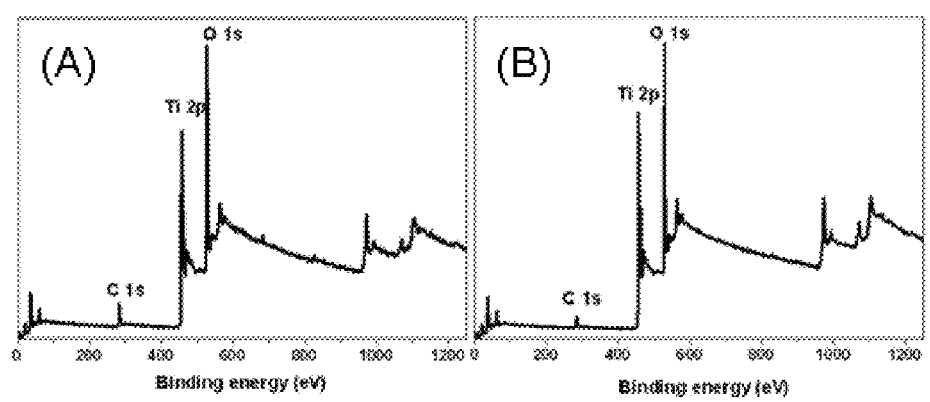
FIG. 7A-B show XPS spectra of photoanode with MWCNTs and without MWCNTs respectively according to the first exemplary embodiment of the presently claimed invention.

XPS spectra of $TiO_2$ nanorod photoanode with and without MWCNTs were measured to further confirm the presence of CNTs in the $TiO_2$ nanorods. The results shows that C is peak of photoanode with 0.1 wt % MWCNTs (in precursor solution for electrospinning) as shown in FIG. 7A is stronger than that without as shown in FIG. 7B, which suggests that the MWCNTs were successfully incorporated in the $TiO_2$ nanorods of the photoanode.

Figure 8:
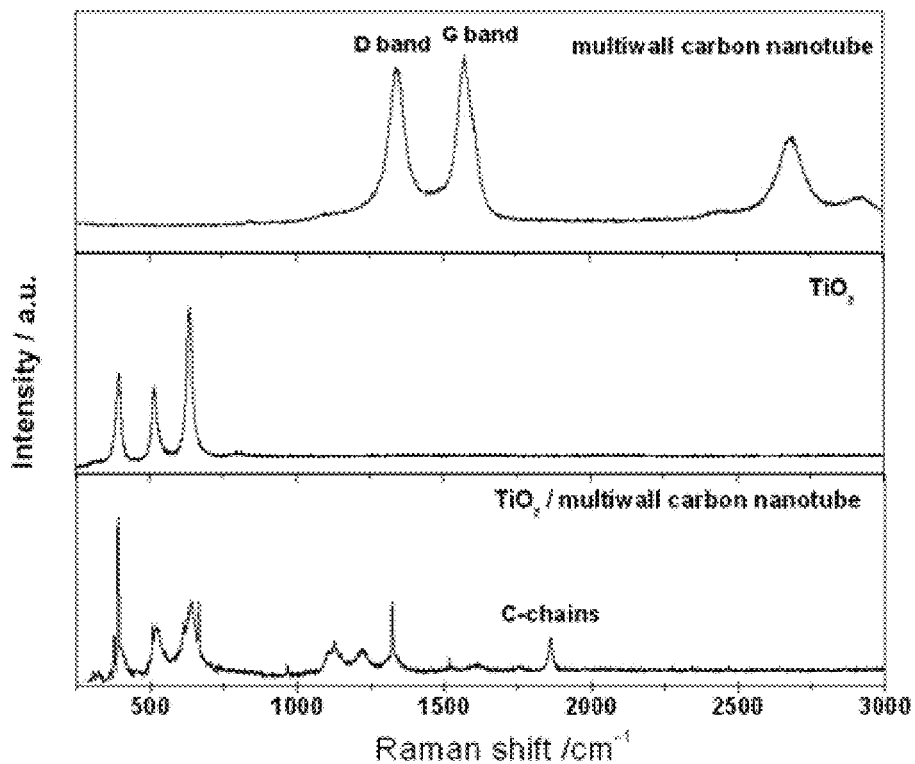
FIG. 8 show Raman spectra of MWCNTs, $TiO_2$ nanorod photoanode without and with MWCNTs respectively according to the first exemplary embodiment of the presently claimed invention.

The Raman spectra of MWCNTs, electrospun $TiO_2$ without and with MWCNTs can be seen in FIG. 8. For the disorder-induced D-band and G-band modes of MWCNTs, peaks that correspond to 1375 and 1575 cm⁻¹ were observed, and the D/G band ratio was 0.93. It is observed that the intensity of G-band modes of MWCNTs was reduced when the MWCNTs were incorporated in the $TiO_2$ nanorods, while a new peak was observed at lower frequency approximately at 1850 cm⁻¹, which corresponds to the 1-D linear C-chains consisting of more than 40 atoms inside the MWCNTs.

To investigate the effect of thickness of the photoanode on the performance of the DSSC device, two sets of devices each with different photoanode thickness, 6.6±0.7 μm and 14.3±0.3 μm, respectively, have been developed for testing. Furthermore, for each device the effect of different MWCNT concentrations in precursor solutions (0.05, 0.10, and 0.15% respectively) on the performance of the device was also studied. The performance of devices of $TiO_2$ nanofiber photoanodes without incorporation of MWCNT served as reference.

Figure 9:
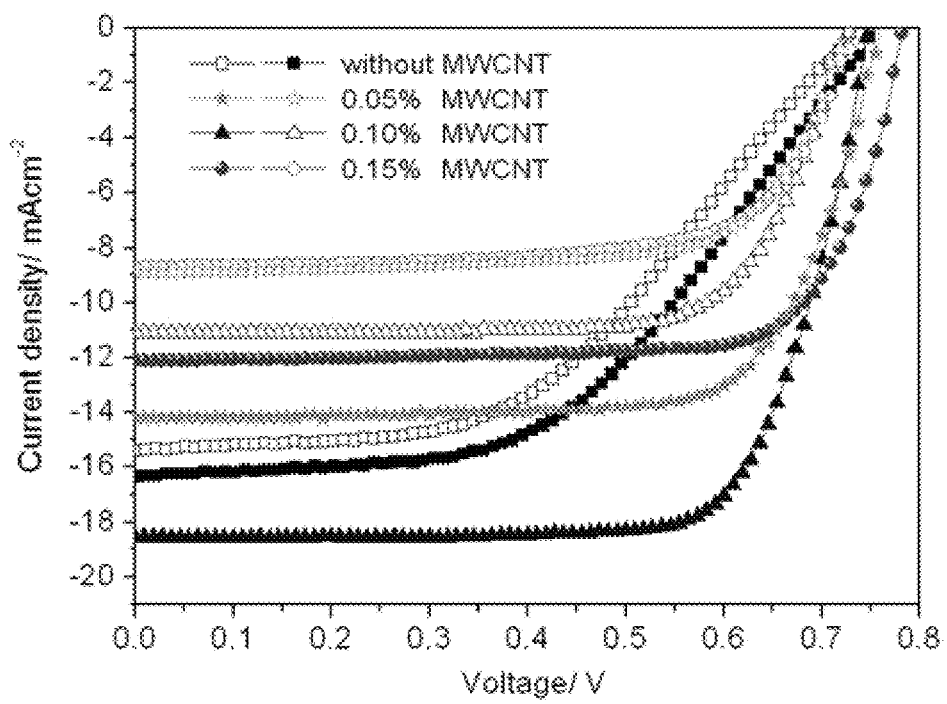
FIG. 9 is a graph showing J-V characteristics of different photoanodes according to the first exemplary embodiment of the presently claimed invention.

FIG. 9 shows the typical photocurrent-voltage (J-V) performance curves of these devices, where hollow-symbol curve represents thinner photoanode with thickness about 6.6±0.7 µm, and solid-symbol curve represents thicker photoanode with thickness about 14.3±0.3 µm. The details of the photovoltaic parameters and performance of the DSSC with different photoanodes are listed in Table 2.

TABLE 2

| MWCNTs wt % in precursor solution | Thickness [µm] | $V_{oc}$ [V] | $J_{sc}$ [mAcm$^{-2}$] | FF [%] | PCE [%] |
|---|---|---|---|---|---|
| 0% | 7.90 | 0.73 | 15.40 | 50.08 | 5.63 |
|  | 16.7 | 0.74 | 16.30 | 51.24 | 6.18 |
| 0.05% | 6.7 | 0.72 | 8.92 | 70.22 | 4.51 |
|  | 11.83 | 0.73 | 11.90 | 71.49 | 6.21 |
|  | 14.47 | 0.76 | 14.20 | 72.27 | 7.80 |
|  | 22.3 | 0.74 | 13.4 | 71.20 | 7.06 |
| 0.10% | 6.04 | 0.72 | 11.10 | 73.07 | 5.84 |
|  | 12.61 | 0.76 | 15.90 | 72.99 | 8.82 |
|  | 14.64 | 0.75 | 18.53 | 73.68 | 10.24 |
|  | 18.99 | 0.76 | 15.93 | 71.73 | 8.28 |
| 0.15% | 7.32 | 0.73 | 8.72 | 75.87 | 4.38 |
|  | 12.84 | 0.74 | 11.90 | 76.76 | 6.76 |
|  | 13.97 | 0.78 | 12.11 | 75.54 | 7.13 |
|  | 19.25 | 0.73 | 8.50 | 74.67 | 4.57 |

From the J-V curves, it can be seen that the fill factor (FF) has been improved through introducing the MWCNT in the photoanode. With the same amount of MWCNT, the thicker photoanode shows both higher short-circuit current density ($J_{sc}$) and open-circuit voltage ($V_{oc}$). It is worth to note that the photoanode with thickness of 14.3±0.3 µm was the optimized thickness, which can be seen in Table 2.

To investigate the effect of the dosage of MWCNT in the photoanode on the performance of the device, different samples with weight percentages of MWCNT from 0.05% to 0.15% in the precursor solution for electrospinning were prepared.

Figure 10:
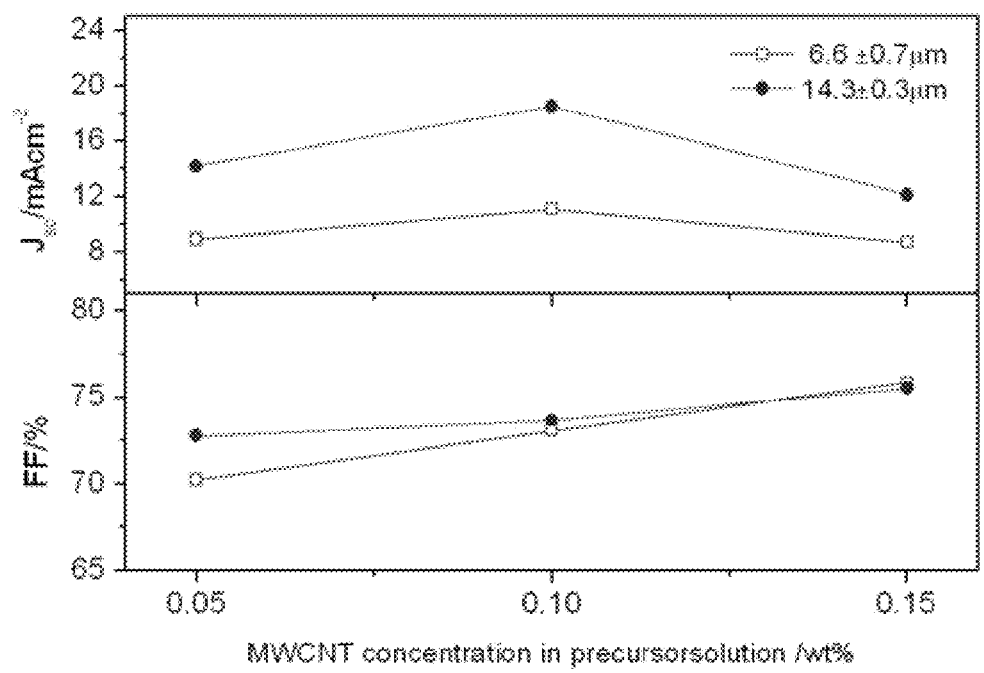
FIG. 10 is a graph showing the effect of MWCNT concentration in the precursor solution on $J_{sc}$ and FF according to the first exemplary embodiment of the presently claimed invention.

FIG. 10 shows the effect of amount of MWCNT on both $J_{sc}$ and FF. By increasing the concentration of MWCNT from 0.05% to 0.1% for the thinner photoanode, Jsc improved from 8.92 to 11.1 mAcm$^{-2}$, which represents a 24% increase. Similar approach shows that 30% enhancement can be realized for the thicker photoanode. However, upon further increase in the amount of MWCNT to 0.15%, $J_{sc}$ decreased in both sets of photoanode devices. Despite this reverse trend, the FF kept increasing with increasing the amount of MWCNT. Measurement of the external quantum efficiency (EQE) was carried out to further investigate the mechanism of enhancement in device performance.

Figure 11:
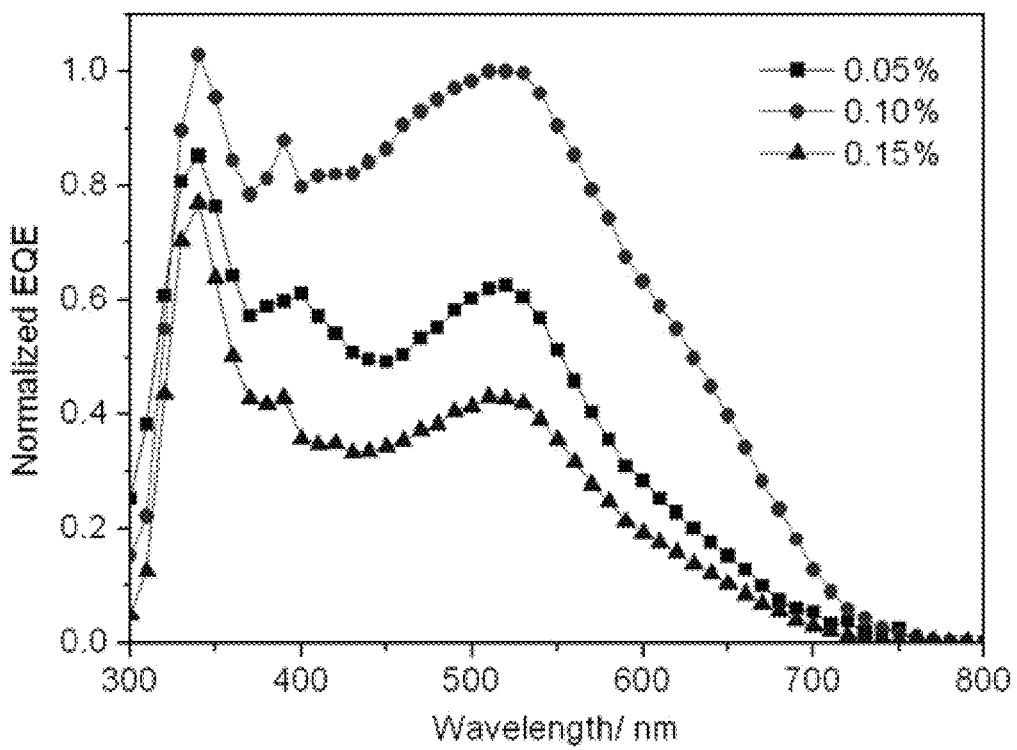
FIG. 11 is a graph showing a normalized EQE spectra of a thicker photoanode with different MWCNT concentrations in the precursor solution according to the first exemplary embodiment of the presently claimed invention.

As seen in FIG. 11, the normalized EQE response at all wavelengths is enhanced when the concentration of MWCNT in the precursor solution was increased from 0.05% to 0.10%. However, further increase in the concentration of MWCNT to 0.15%, results in reduction in EQE at all wavelengths. This can be understood from the following. Given the MWCNT is incorporated inside the photoanode, this can rapidly capture and transport the photogenerated electrons and concurrently reduce the undesirable recombination and back-reaction. Therefore, at low MWCNT concentration increasing the amount of MWCNT in the photoanode improves the charge collection efficiency and reduces the recombination, which results in improved performance ($J_{sc}$, EQE). However, at higher concentration of MWCNT, there is competition on light harvesting between dye molecules (N719) and MWCNT, and as a result the dye loading capacity and thus the efficiency are both reduced. There could be other more complicated mechanisms involved with MWCNT overdose. Therefore, it is necessary to optimize the amount of MWCNTs in the photoanode to balance the electron transport property and dye loading capacity. Upon optimization of the parameters for the photoanode, a high efficiency of 10.24% has been attained for the photoanode with nanorods incorporating 0.1% MWCNTs in the precursor solution. It is worthy to note that the improved efficiency for the photoanode incorporating MWCNTs is largely due to the improved FF. Based on the previous studies, the FF of devices without incorporating MWCNTs in the photoanode was typically between 50 and 55%. By incorporating MWCNTs in the photoanode, the FF is boost to 70-75%, which is a 35% increase. Therefore, introducing MWCNTs in a photoanode can improve the electron transport properties and suppress the recombination, both of which lead to an improvement of the charge collection efficiency.

The $TiO_2$/MWCNT composite of the photoanode comprises approximately 2 to 6 percent by weight of the MWCNTs with respect to range of 0.05% to 0.15% of the MWCNTs per weight in the precursor solution. Preferably, the $TiO_2$/MWCNT composite comprises 4 percent by weight of the MWCNTs as seen in these results.

In summary, MWCNTs, which performs an ideal electron transport superhighway, are introduced inside $TiO_2$ nanorods. This configuration is successfully applied in the photoanode to improve the performance of a DSSC device. Different concentrations of MWCNTs in precursor solution for electrospinning on the device performance have been investigated. The FF of the DSSC device increases as the MWCNT amount in the nanorods increases from 0.05% to 0.15% (in precursor solution). The $J_{sc}$ first increases due to improved electron charge transport property and subsequently it decreases due to a lower dye loading capacity of the photoanode at high MWCNT concentration. At a 0.1% MWCNT concentration, the DSSC device exhibits the highest efficiency of 10.24%, with high $J_{sc}$ of 18.53 mA cm$^{-2}$ and a FF of 74%. The improved efficiency is largely due to the improved FF. These positive results confirm that the electrospun nanorods incorporating CNTs provide an effective means to utilize economical materials optimally for developing a photoanode with efficient charge transport properties for realizing solar energy conversion in the future.

Consequently, as shown from the above experimental results, the MWCNTs are successfully incorporated into the $TiO_2$ nanorods according to the presently claimed invention. Such configuration of the nanocomposite is able to improve charge transfer in the semi-conductor photoanode once electrons are injected from the sensitzied dye, and reduce the number of electrons in combining with oxidized dye, and with electrolyte (liquid), or holes (solid-state).

Example 2

Similar to the experimental conditions of Example 1, the electrospun nanofibers were calcinated at the final temperature of 550° C. (for 2 h) instead of the optimal 450° C. as used in Example 1. Accordingly, three tests were carried out at 550° C. with a rate change in temperature of 1° C./min, and with 0.1% wt MWCNTs in precursor solution Three samples A-C were obtained. It was expected that more rutile phase was found in the $TiO_2$ nanofibers, which were unfavorable for the solar cell. Indeed, as shown on Table 3, tests on these samples A-C reveal lower fill factor less than 70% with exception of sample B, and lower short circuit density current ($J_{sc}$) falling short of 12 mAcm$^{-2}$. The highest power conversion efficiency (PCE) corresponds to 5.54% which is only half of 10.24% obtained at the optimal condition with the final calcination temperature of 450° C.

TABLE 3

| Sample | $V_{oc}$ [V] | $J_{sc}$ [mAcm$^{-2}$] | FF [%] | PCE [%] |
|---|---|---|---|---|
| A | 0.70 | 7.21 | 61.82 | 3.12 |
| B | 0.72 | 10.5 | 73.28 | 5.54 |
| C | 0.72 | 5.08 | 63.15 | 2.31 |

Example 3

After confirming the preferred optimal calcination temperature of 450° C. by keeping the rate of temperature change at 1° C./min, additional tests were made at 450° C. but with the rate of temperature change increased to 3° C./min. Four tests were carried out at 450° C. with a rate change in temperature of 3° C./min, and with 0.1% wt MWCNTs in precursor solution. Four samples D-G were obtained. Firstly, the photoanodes (or composites) were observed to have cracks due to too rapid change in the oven temperature. The cracks in photoanodes are detrimental to performance of the solar cells. Indeed, Table 4 shows disappointing PCE less than 2.5% and much lower $J_{sc}$ of less than 5.5 mAcm$^{-2}$ despite the final calcination temperature being at the optimal value of 450° C.

TABLE 4

| Sample | Thickness [μm] | $V_{oc}$ [V] | $J_{sc}$ [mAcm$^{-2}$] | FF [%] | PCE [%] |
|---|---|---|---|---|---|
| D | 2.2 | 0.73 | 3.63 | 59 | 1.56 |
| E | 16.9 | 0.71 | 5.47 | 64 | 2.48 |
| F | 13.5 | 0.69 | 3.64 | 47 | 1.19 |
| G | 6.5 | 0.70 | 4.28 | 64 | 1.91 |

To conclude, workable DSSC cell can be produced with calcinations temperature between 450-550° C., and with rate of change in temperature to-and-from the final calcinations temperature of 1° C.-3° C./min. The preferred optimal final calcinations temperature is 450° C., and the preferred optimal rate of change in temperature for annealing the photoanode is 1° C./min to avoid rapid thermal changes which result in cracks in the photoanode.

Accordingly, the nanocomposite of the presently claimed invention is not limited to the application of solar cell. The nanocomposite is applicable to photocatalyst, nano-transistor, sensor, or lithium battery.

Figure 12:
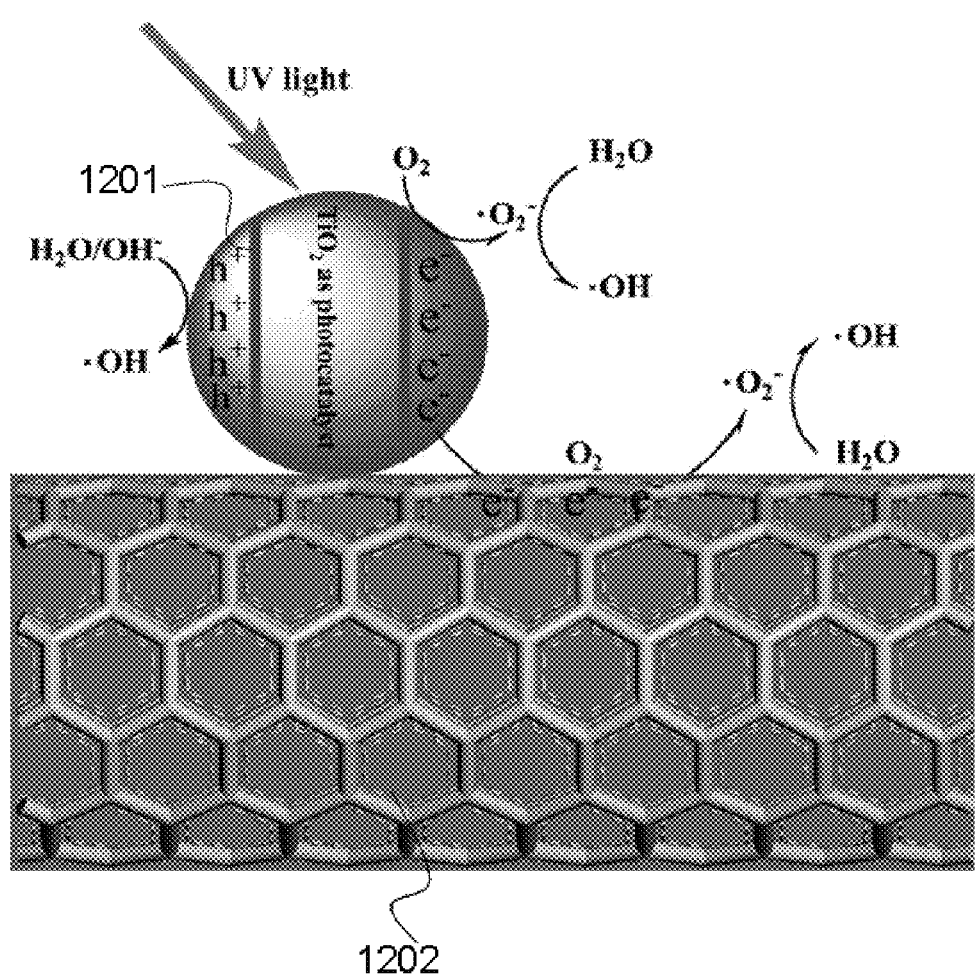
FIG. 12 is a schematic diagram of a nanocomposite used for a photocatalysis process in removal of nitiric oxide according to an embodiment of the presently claimed invention.

FIG. 12 is a schematic diagram of a nanocomposite used for a photocatalysis process in removal of nitric oxide according to an embodiment of the presently claimed invention. The nanocomposite comprises a TiO$_2$ nanostructure 1201 (partially shown in FIG. 12) and a carbon nanotube 1202. The TiO$_2$ nanostructure 1201 is applied as a photocatalyst. The carbon nanotube 1202 is embedded inside the TiO$_2$ nanostructure 1201. Under UV irradiation, electron-hole pairs are generated in the TiO$_2$ nanostructure 1201. The generated electrons are transferred to, and further trapped within the carbon nanotube 1202, serving as an electron reservoir. The electrons trapped by the carbon nanotube 1202 are less likely to be recombined with the holes so that they are further used for removal of nitric oxide, as shown in the following chemical equations:

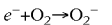

$$e^- + O_2 \rightarrow O_2^-$$

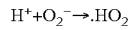

$$H^+ + O_2^- \rightarrow .HO_2$$

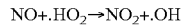

$$NO + .HO_2 \rightarrow NO_2 + .OH$$

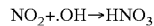

$$NO_2 + .OH \rightarrow HNO_3$$

Due to the superior adsorption property of the carbon nanotube 1202, active species such as oxygen, water vapor, nitrogen monoxide, nitrogen dioxide are effectively adsorbed on the surface of TiO$_2$ nanostructure 1201 and more so on the surface of the carbon nanotube 1202. Photogenerated electrons combined with the adsorbed oxygen to generate oxygen radicals, which further combine with hydrogen ions from the water vapor adsorbed on the surface of semiconductor/CNT to produce hydroxyl radicals which convert NO to NO$_2$, and subsequently to nitric acid. Apart from having the unique advantage of providing large surface area for adsorption of the active species, the carbon nanotube 1202 also provides a large number of electrons in the reserve to initiate the above reactions, enhancing the rate in converting NO ultimately to nitric acid.

Figure 13:
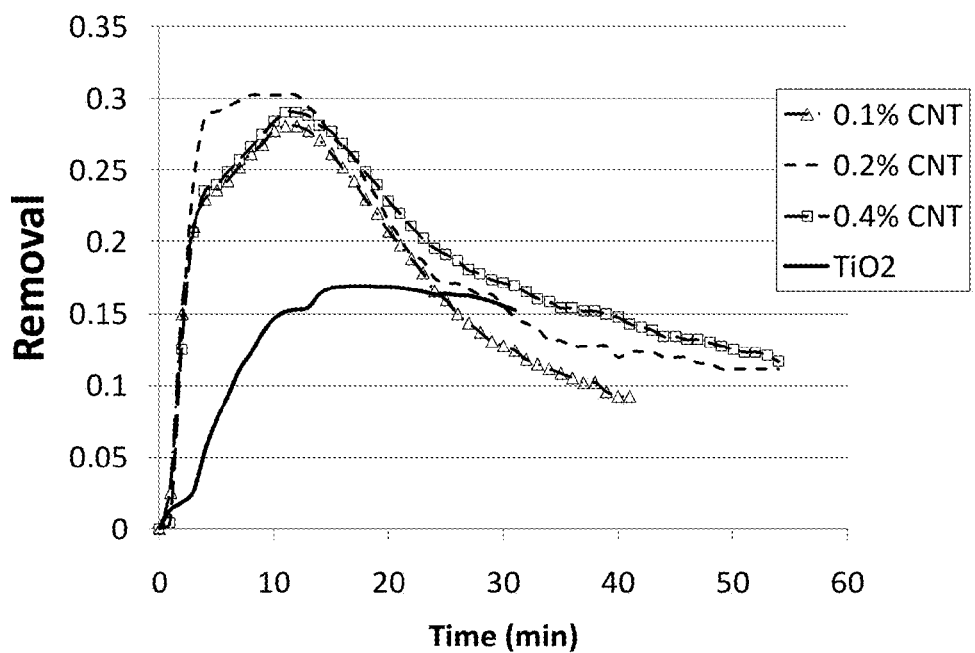
FIG. 13 is a graph showing nitric oxide removal rates under different percentages of CNT loadings according to an embodiment of the presently claimed invention.

FIG. 13 is a graph showing nitric oxide removal rates under different percentages of CNT loadings according to an embodiment of the presently claimed invention. The amount of the nitric oxide removal is plotted with time. As shown in the graph, the removal rate of NO with CNT loaded TiO$_2$ nanorods increases by twice the magnitude as compared with that without CNT loaded TiO$_2$ nanorods.

According to another embodiment of the presently claimed invention, a photocatalyst comprising TiO$_2$ doped with carbon nanotubes according to the present invention is applicable to degradation of benzene and methyl orange.

According to an embodiment of the presently claimed invention, a composite of the present invention comprising zinc oxide nanorods incorporated with CNTs, is used to fabricate a nano-transistor for field-effect transistor with terminals.

Figure 14:
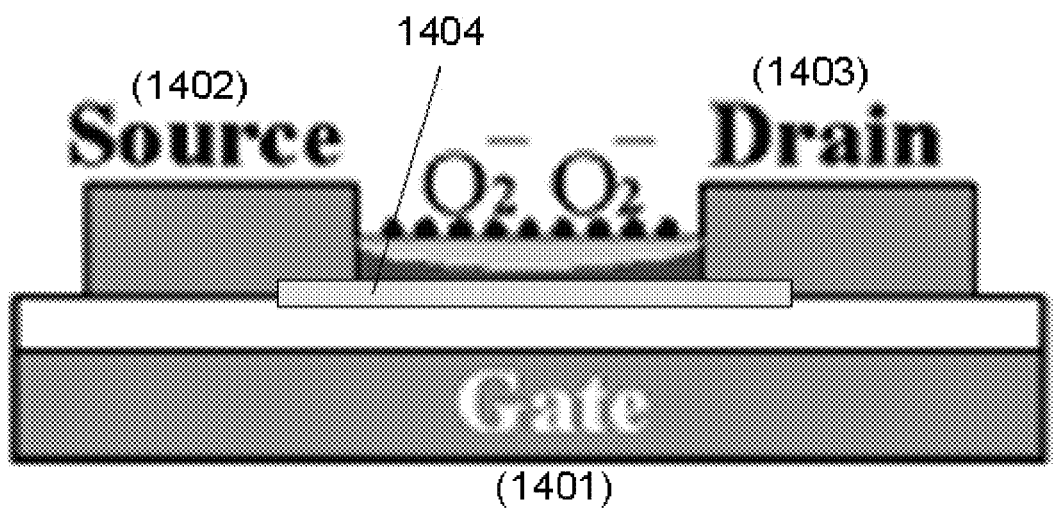
FIG. 14 is a schematic diagram showing a field-effect transistor comprising a layer of zinc oxide nanorods incorporated with CNTs according to an embodiment of the presently claimed invention.

FIG. 14 is a schematic diagram showing a field-effect transistor comprising a layer of zinc oxide nanorods incorporated with CNTs according to an embodiment of the presently claimed invention. The field-effect transistor comprises a gate 1401, a source 1402, and a drain 1403. A layer of zinc oxide nanorods incorporated with CNTs 1404 is deposited on top of the gate 1401, and located between the source 1402 and the drain 1403, that helps to increase current between the two terminals. The layer 1404 also acts as a switch to control on/off of current in the two terminals as used in many processors and integrated circuits. In addition, the speed of the transistor is increased due to efficient transfer of charges in CNTs inside the semi-conductor, and sensitivity is also increased since more charges are potentially stored inside the CNTs.

According to an embodiment of the presently claimed invention, a FET comprising the composite of the present invention is applicable to oxygen sensor as oxygen adsorption onto the gate changes the electrical properties. The added CNTs between a source and a sink of the FET can make the gain much more sensitive.

According to an embodiment of the presently claimed invention, the composite of the present invention is applicable to biosensor since the carbon-based nanostructures can increase hydrophilicity of biosensor. Better wetting of biological cells implies a stronger signal for the sensor.

According to an embodiment of the presently claimed invention, an electrochemical biosensor for cancer cells based on $TiO_2$/CNT nanocomposite modified electrodes is provided. The $TiO_2$/CNT nanocomposite modified electrode can accelerate heterogeneous electron transfer rates, and thus enhance the relevant detection signal. This significant increase is attributed to the amplification in the surface area of the electrode by the modified nanocomposites. Meanwhile, the electrochemical response of $K_3[Fe(CN)_6]$ can be obviously increased when the electrode is covered with cancer cells.

According to an embodiment of the presently claimed invention, a carbon paper modified by the $TiO_2$/CNT nanocomposites of the present invention is provided.

According to an embodiment of the presently claimed invention, Pd-doped $TiO_2$ nanofiber networks for gas sensor applications comprising the nanocomposites of the present invention are provided. Noble metal acts as an electron acceptor on semiconducting oxide surfaces, which contributes to the increase of the depleted layer. Therefore, the change in resistance is larger as compared to the pristine oxide case, leading to an increase in response.

According to an embodiment of the presently claimed invention, Li-ion batteries comprising the nanocomposites of the present invention are provided. $TiO_2$ is an abundant, low cost, and environmentally benign material, which is also structurally stable during Li insertion/extraction and is intrinsically safe by avoiding Li electrochemical deposition. Meanwhile, hybrid nanostructures of the present invention, such as anatase $TiO_2$—CNT hybrids, anatase $TiO_2$—$RuO_2$ nanocomposite, combined with conventional carbon additives have demonstrated an increased Li-ion insertion/extraction capacity in the hybrid electrodes at high charge/discharge rates. The nanocomposite of the present invention is able to lower the impedance of the Li-ion batteries, and increase the corresponding storage capacity.

Consequently, the composite of the present invention is able to provide fast electric charge transport, and reduce the rate of electron-hole recombination, ultimately increasing the power conversion efficiency for use in solar cell; provide fast electrons transport, storage of electrons and large surface area for adsorption and reaction sites of active molecular species taking part in photocatalytic reaction; change the sensitivity of a surface for biological and chemical sensing purposes for use in biological and chemical sensors; and lower the impedance and increase the charge storage capacity of a lithium-ion battery.

The foregoing description of the present invention has been provided for the purposes of illustration and description. It is not intended to be exhaustive or to limit the invention to the precise forms disclosed. Many modifications and variations will be apparent to the practitioner skilled in the art.

The embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the following claims and their equivalence.

What is claimed is:

1. A composite comprising a plurality of one-dimensional semiconductor nanocomposites, wherein each of the one-dimensional semiconductor nanocomposite comprises:
   one or more semiconductor media; and
   one or more highly conductive nanostructures;
   wherein the one or more highly conductive nanostructures are dispersed within the each of the one-dimensional semiconductor nanocomposite, and are covered substantially by and interfacially bonded to the one or more semiconductor media, leading to improved electrical conductivity of the one-dimensional semiconductor nanocomposite;
   wherein the one-dimensional semiconductor nanocomposites are in a structure of nanorod;
   wherein the semiconductor medium is titanium dioxide with substantial anatase phase;
   wherein the highly conductive nanostructures are multi-wall carbon nanotubes; and
   wherein the composite comprises 2 to 6 percent by weight of the multi-wall carbon nanotubes.

2. A method for fabricating the composite of claim 1, comprising the steps of:
   preparing a semiconductor precursor solution, comprising titanium isopropoxide, polyvinylpyrrolidone, acetic acid, and ethanol;
   adding a plurality of multi-wall carbon nanotubes to the semiconductor precursor solution to form a solution, wherein the solution comprises 0.05 to 0.15 percent by weight of the multi-wall carbon nanotubes;
   electrospinning the solution by applying a voltage over a collector distance to form a plurality of titanium dioxide nanofibers incorporated with the multi-wall carbon nanotubes;
   heating up the plurality of the titanium nanofibers incorporated with the multi-wall carbon nanotubes with a temperature rise rate of approximately 1° C./min until reaching a calcination temperature of approximately 450° C.;
   calcinating the plurality of the titanium nanofibers incorporated with the multi-wall carbon nanotubes at the calcination temperature of approximately 450° C. for approximately 2 hours; and
   cooling down the plurality of the titanium nanofibers incorporated with the multi-wall carbon nanotubes from the calcination temperature of approximately 450° C. with a temperature decrease rate of approximately −1° C./min until formation of the composite comprising a plurality of one-dimensional titanium dioxide nanorods incorporated with the multi-wall carbon nanotubes.

3. A composite comprising a plurality of one-dimensional semiconductor nanocomposites, wherein each of the one-dimensional semiconductor nanocomposites comprises:
   one or more semiconductor media; and
   one or more highly conductive nanostructures;
   wherein the one or more highly conductive nanostructures are dispersed within the each of the one-dimensional semiconductor nanocomposites, and are covered substantially by and interfacially bonded to the one or more semiconductor media.

4. The composite of claim 3, wherein the one-dimensional semiconductor nanocomposite is in a structure selected from the group consisting of nanorod, nanowire, nanofiber, and nanorice.

5. The composite of claim 3, wherein material of the one or more highly conductive nanostructures is carbon-based, gold, silver, aluminum, zinc, nickel, platinum, or tin.

6. The composite of claim 3, wherein the one or more highly conductive nanostructures are selected from the group consisting of single-wall carbon nanotubes, multi-wall carbon nanotubes, carbon nanorods, carbon nanowires, graphene sheets, and their combinations.

7. The composite of claim 3, wherein the composite comprises 2 to 10 percent by weight of the highly conductive nanostructures.

8. A method for fabricating the composite of claim 3, comprising the steps of:
preparing a semiconductor precursor solution;
adding a plurality of highly conductive nanostructures to the semiconductor precursor solution to form a solution;
producing a plurality of preformed one-dimensional semiconductor nanocomposites with the solution;
heating up the plurality of the preformed one-dimensional semiconductor nanocomposites with a temperature rise rate having a range from 0.1° C./min to 5° C./min until reaching a calcination temperature having a range from 200° C. to 1000° C.;
calcinating the plurality of the preformed one-dimensional semiconductor nanocomposites with the calcination temperature for a calcination period; and
cooling down the plurality of the preformed one-dimensional semiconductor nanocomposites form the calcination temperature at a temperature decreases rate having a range −0.1° C./min to −5° C./min until formation of the composite.

9. The method of claim 8, wherein the temperature rise rate has a range from 0.1° C./min to 3° C./min.

10. The method of claim 8, wherein the temperature decrease rate has a range from −0.1° C./min to −3° C./min.

11. The method of claim 8, wherein the calcination temperature has a range from 300° C. to 600° C.

12. The method of claim 8, wherein the step of producing the plurality of the preformed one-dimensional semiconductor nanocomposites with the solution comprises:
electrospinning the solution by applying a voltage over a collector distance.

13. The method of claim 8, wherein the solution comprises 0.05 to 0.15 percent by weight of the highly conductive nanostructures.

14. A one-dimensional semiconductor nanocomposite comprising:
one or more semiconductor media; and
one or more highly conductive nanostructures;
wherein the one or more highly conductive nanostructures are dispersed within the one-dimensional semiconductor nanocomposite, and are covered substantially by and interfacially bonded to the one or more semiconductor media.

15. The nanocomposite of claim 14, wherein the one-dimensional semiconductor nanocomposite is in a structure selected from the group consisting of nanorod, nanowire, nanofiber, and nanorice.

16. The nanocomposite of claim 14, wherein material of the one or more highly conductive nanostructures is carbon-based, gold, silver, aluminum, zinc, nickel, platinum, or tin.

17. The nanocomposite of claim 14, wherein the one or more highly conductive nanostructures are selected from the group consisting of single-wall carbon nanotubes, multi-wall carbon nanotubes, carbon nanorods, carbon nanowires, graphene sheets, and their combinations.

18. A method for fabricating the one-dimensional semiconductor nanocomposite of claim 14, comprising the steps of:
preparing a semiconductor precursor solution;
adding a plurality of highly conductive nanostructures to the semiconductor precursor solution to form a solution;
producing a preformed one-dimensional semiconductor nanocomposite with the solution;
heating up the preformed one-dimensional semiconductor nanocomposites with a temperature rise rate having a range from 0° C./min to 5° C./min until reaching a calcination temperature having a range from 200° C. to 1000° C.;
calcinating the plurality of the preformed one-dimensional semiconductor nanocomposites with the calcination temperature to form the composite for a calcination period; and
cooling down the preformed one-dimensional semiconductor nanocomposites from the calcination temperature until formation of the nanocomposite.

19. The method of claim 18, wherein the temperature rise rate has a range from 0.1° C./min to 3° C./min, and the temperature decrease rate has a range from −0.1° C./min to −3° C./min.

20. The method of claim 18, wherein the calcination temperature has a range from 300° C. to 600° C.

* * * * *